(12) United States Patent
Sunkavalli et al.

(10) Patent No.: US 6,452,840 B1
(45) Date of Patent: Sep. 17, 2002

(54) FEEDBACK METHOD TO OPTIMIZE ELECTRIC FIELD DURING CHANNEL ERASE OF FLASH MEMORY DEVICES

(75) Inventors: Ravi S. Sunkavalli, Milpitas; Lee Cleveland, Santa Clara; Sameer S. Haddad, San Jose; Richard Fastow, Cupertino; Tim Thurgate, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 18 days.

(21) Appl. No.: 09/693,649

(22) Filed: Oct. 21, 2000

(51) Int. Cl.[7] .............................................. G11C 16/04
(52) U.S. Cl. .............................. 365/185.3; 365/185.29; 365/218
(58) Field of Search ..................... 365/185.3, 185.29, 365/218

(56) References Cited

U.S. PATENT DOCUMENTS

| | | | | | |
|---|---|---|---|---|---|
| 5,477,499 A | * | 12/1995 | Van Buskirk et al. | ...... | 365/218 |
| 5,930,174 A | * | 7/1999 | Chen et al. | ............ | 365/185.29 |
| 6,091,642 A | * | 7/2000 | Pasotti et al. | ........... | 365/185.29 |
| 6,122,198 A | * | 9/2000 | Haddad et al. | ........ | 365/185.22 |
| 6,157,572 A | * | 12/2000 | Haddad et al. | ........ | 365/185.22 |
| 6,240,023 B1 | * | 5/2001 | Roohparvar | .............. | 365/185.3 |
| 6,252,803 B1 | * | 6/2001 | Fastow et al. | ......... | 365/185.22 |

* cited by examiner

Primary Examiner—Richard Elms
Assistant Examiner—Tuan T. Nguyen
(74) Attorney, Agent, or Firm—H. Donald Nelson

(57) ABSTRACT

A method of erasing a flash memory device that improves reliability and reduces the decrease in erase speed. The state of erasure is determined either during an erase phase or a verify phase and the information is fedback to a controller that adjusts the erase vertical electrical field that is to be applied to the array. The vertical electrical field is adjusted by changing the gate voltage, the well voltage or changing both simultaneously.

18 Claims, 16 Drawing Sheets

FEEDBACK METHOD TO OPTIMIZE ELECTRIC FIELD DURING CHANNEL ERASE OF FLASH MEMORY DEVICES

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing microelectronic flash Electrically Erasable Programmable Read-Only Memory using a feedback mechanism to optimize the electric field during erase and to minimize reliability problems and to minimize the degradation of erase speed.

2. Discussion of the Related Art

A microelectronic flash or block erase Electrically Erasable Programmable Read-Only Memory (Flash EEPROM) includes an array of cells that can be independently programmed and read. The size of each cell and thereby the memory are decreased by omitting transistors known as select transistors that enable each cell to be erased independently. As a result, all of the cells must be erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying a voltage, typically about 9 volts to the control gate, applying a voltage of approximately 5 volts to the drain and grounding the source, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically about 5 volts to the control gate, applying about 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 10–12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of minus 10 volts to the control gate, applying 5 volts to the source and allowing the drain to float can also erase a cell. Another method of erasing a cell is by applying 5V to the P-well and minus 10 volts to the control gate while allowing the source/drain to float.

A problem with the conventional flash EEPROM cell arrangement is that due to manufacturing tolerances, some cells become overerased before other cells are sufficiently erased. The floating gates of the overerased cells are depleted of electrons and become positively charged. This causes the overerased cells to function as depletion mode transistors that cannot be turned off by normal operating voltages applied to their control gates, and introduces leakage current during subsequent program and read operations.

More specifically, during program and read operations only one wordline that is connected to the control gates of a row of cells is held high at a time, while the other wordlines are grounded. However, a positive voltage is applied to the drains of all of the cells. If the threshold voltage of an unselected cell is very low, zero or negative, leakage current will flow through the source, channel and drain of the cell.

In a typical flash EEPROM, the drains of a large number, for example 512 transistor memory cells are connected to a bitline. If a substantial number of cells on the bitline are drawing background leakage current, the total leakage current on the bitline can exceed the cell read current. This makes it impossible to read the state of a cell on the bitline and renders the memory inoperative. The threshold voltages of the bits in an array typically form a voltage distribution with the least erased cells having a relatively high threshold voltage $V_T$MAX whereas the most overerased cells have a minimum acceptable value $V_T$MIN that can be zero or negative. The lower the threshold voltage and the wider the threshold voltage distribution the higher the leakage current. It is therefore desirable to prevent cells from being overerased and to reduce the threshold voltage distribution to as low a range as possible, with ideally all cells having the same high threshold voltage after erase on the order of 2 volts.

It is known in the art to reduce the threshold voltage distribution by performing an overerase correction operation that reprograms the most overerased cells to a higher threshold voltage. This operation will result in the threshold voltage distribution with all of the cells having a threshold voltage above a minimum acceptable value. An overerase correction operation of this type is generally known as Automatic Programming Disturb (APD).

An example of an APD method that is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. The method includes sensing for overerased cells and applying programming pulses thereto that bring their threshold voltages back up to acceptable values. Following application of an erase pulse, undererase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current and thereby determine if the threshold voltage of the cell is above a value of, for example, 2 volts. If the cell is undererased (threshold voltage above 2 volts), the bitline current will be low. In this case, an erase pulse is applied to all of the cells and the first cell is erase verified again. After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 volt to the first bitline and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 volts to the bitline for a predetermined length of time such as 100 μs. After application of the overerase correction pulse the bitline is erase verified again. If the bitline current is still high indicating that one or more overerased cell still remains connected to the bitline, another overerase correction pulse is applied. This procedure is repeated for all of the bitlines in sequence. The procedure is repeated as many times as necessary until the bitline current is reduced to the predetermined value which is lower than the read current. Then, the procedure is performed for the rest of the cells in the first row and following rows until all of the cells in the memory have been erase verified.

By performing the overerase correction procedure after each erase pulse, the extent to which cells are overerased is reduced, improving the endurance of cells. Further, because overerased cells are corrected after each erase pulse, bitline leakage current is reduced during erase verify, thus preventing undererased cells from existing upon completion of the erase verify procedure.

Significant problems exist during erase that result in decreased reliability of the memory cell. During negative gate edge erase some current flows from the double diffused source region into the substrate when the source junction is reverse biased during erase. This current is referred to as band-to-band tunneling current. The magnitude of the band-to-band tunneling current depends upon the magnitude of the reverse bias voltage applied to the source region. With the control gate biased at a negative voltage, the hole component (called "hot holes") of the band-to-band tunneling current tends to follow the electric field and bombard the semiconductor dielectric interface between the substrate and the tunnel oxide. These hot holes can damage the interface by generating undesirable interface states. In addition, some of these hot holes may actually have enough energy to be injected into the tunnel oxide, where they are trapped. These trapped hot holes degrade the performance of the memory device. The negative control gate voltage technique for erasing memory cells generate hole trap-ups and interface states that cause reliability problems such as window-opening, charge loss, erratic erase and accentuating gate disturb. These interface states and trapped holes distribute themselves laterally from the source PN junction that is formed at the interface between the source and substrate and into the channel region of the cell. The peak density and the width of this trapped hole distribution depend upon both the junction bias and the control gate bias during the negative gate edge erase operation.

During a negative gate channel erase procedure, the electrons in the floating gate tunnel vertically through the tunnel oxide into the channel region of the cell. Since there is no electrical bias between the source region and the p-well region, there is no band-to-band current. However, other device reliability problems result. For example, since erasing is done along the channel region, interface generation and oxide trap-up are distributed along the entire length of the channel region. Such a concentration of interface states and oxide trap-up degrades the memory cell read current, which may in turn slow down the reading speed and eventually cause read errors. Trap-up at the portion of the oxide layer near the drain junction may also retard hot electron injection during programming. The amount of interface generation and oxide trap-up are dependent upon the peak electric field generated during the erase procedure.

Therefore, what is needed are methods of erasing memory cells that continuously monitors the electric field during erase and adjusts the voltages responsible for the electric field without reducing the erase speed.

DISCLOSURE OF THE INVENTION

According to the present invention, the foregoing and other objects and advantages are obtained by a method of erasing a flash Electrically-Erasable Programmable Read Only Memory (EEPROM) device.

In accordance with an aspect of the invention an erase procedure is initiated to erase the memory device array, a selected number of memory cells are erase verified and a state of erasure is determined during the erase verify. The state of erasure information is used to adjust the erase vertical electrical field that is to be applied to the array. This procedure is repeated until all the memory cells have been erased. The state of erasure is determined by biasing the gates of the selected memory cells and measuring the drain voltage of a selected column of memory cells for a given band-to-band current in the selected column.

In accordance with another aspect of the invention, the drain voltage of all the columns of memory cells for a given band-to-band current in the columns is measured and a state of erasure determined.

In accordance with another aspect of the invention, the state of erasure is determined during the application of an erase pulse to the array. The state of erasure information is used to adjust the erase vertical electrical field that is being applied to the array or that is to be applied to the array. The state of erasure is determined by biasing the drain voltage of a selected column of memory cells above the well voltage and measuring the drain voltage for a given band-to-band current in the column.

In accordance with another aspect of the invention, after each memory cell is erase verified and after an erase pulse has been applied to the array an entire APDE sequence is performed on the array. After the last column of memory cells has been erase verified a final APDE sequence is performed.

The described method thus provides a method of erasing flash EEPROM cells that increases reliability and minimizes the reduction in erase speed.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention that illustrate the best modes presently contemplated by the inventors for practicing the invention.

Figure 1A:
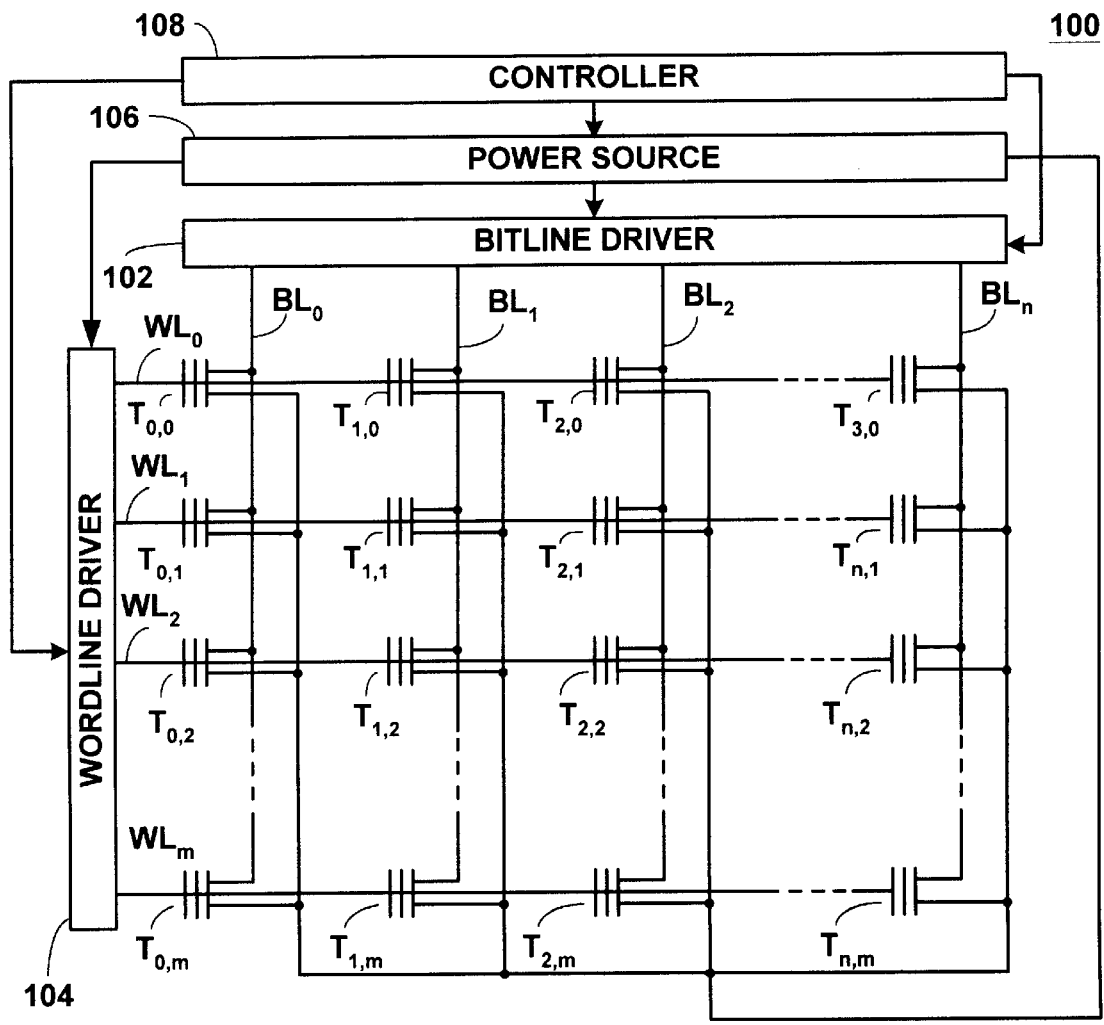
FIG. 1A is a simplified electrical schematic diagram of a typical flash EEPROM memory device.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines, whereas a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
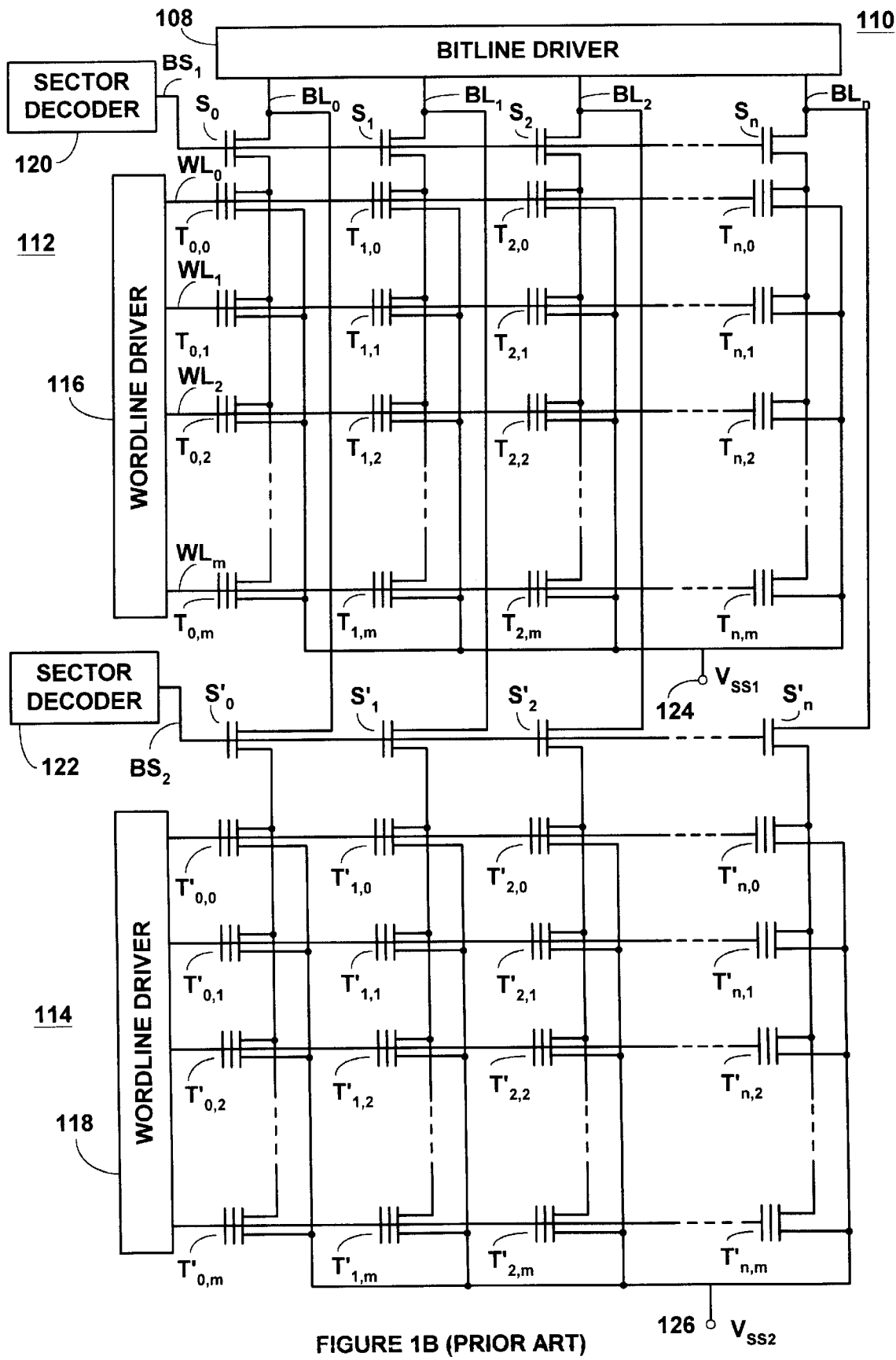
FIG. 1B is similar to FIG. 1A but illustrates a flash EEPROM memory device having cells arranged in two pages, sectors or banks.

FIG. 1B illustrates another flash EEPROM memory 110 which is similar to the memory 100 except that the cells are divided into a banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_a$ and $S'_0$ to $S'_0$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently.

Figure 2A:
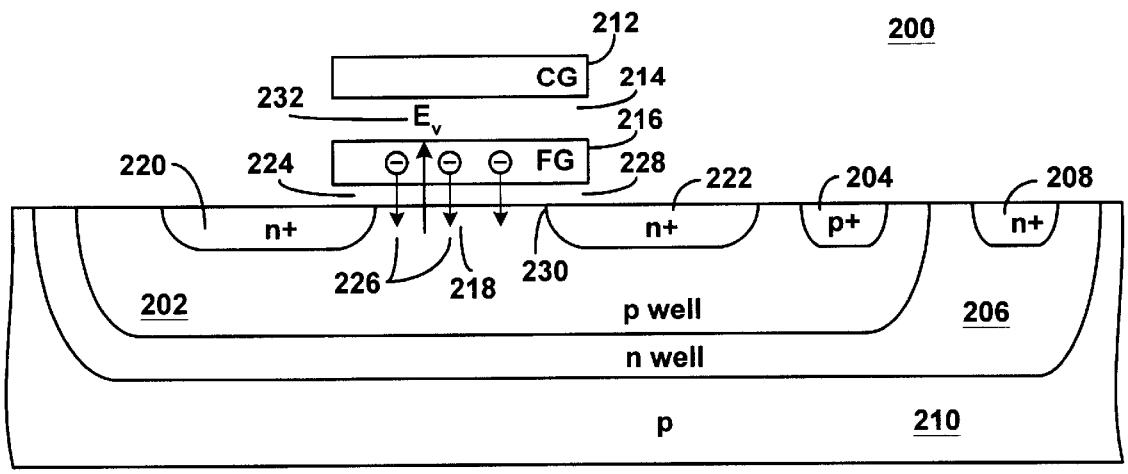
FIG. 2A is a cross-sectional view of a flash EEPROM memory cell illustrating a negative gate channel erase method of erasing the memory cell.

FIG. 2A is a simplified sectional view illustrating the construction of a memory cell 200. The memory cell 200 is formed in a p-well 202, which may be electrically contacted using p+region 204. The p-well 202 is formed in an n-well region 206, which may be electrically contacted using n+ region 208. The n-well region 206 is formed in a p-type substrate 210. To erase memory cell 200, a large negative voltage of about minus 10 volts is applied to control gate 212. Control gate 212 is formed on insulator 214, which is formed on floating gate 216. At the same time as the negative voltage is applied to the control gate, a moderate positive voltage of about 5 volts is applied to the p-type channel region 218 through p+ region 204 and p-well region 202. Because the p-type substrate 210 is grounded, the application of a positive voltage through p+ contact region 204 to p-type channel region 218 requires the formation of the isolated p-well 202 inside n-well 206. During erase, source region 220 and drain region 222 are floated at a diode potential below the bias voltage of p-well 202. This potential depends upon the geometry of the source and drain regions 220 & 222 and also upon the amount of leakage current from the drain and source regions. This erase technique is referred to as the negative gate channel erase technique. In the negative gate channel erase technique, the electrons in the floating gate 216 tunnel vertically through floating gate dielectric 224 into the channel region 218 as indicated by the vertical, downwardly pointing arrows 226. Since the P-Well is biased positively and the source region is floating, the P-Well to Source junction is forward biased and no band to band tunneling exists. However, in a stacked gate flash memory, other device reliability problems may result. For instance, since erasing is done over the channel region 218, interface state generation and oxide trap-up are all distributed along the channel region 218. Such a concentration of interface states and oxide trap-up degrades the memory cell read current, which may in turn slow down the reading speed and may eventually cause read errors. Trap-up at the portion 228 of the oxide layer 224, which lies beneath floating gate 216 and above the drain junction 230, may also retard hot electron injection during programming. The vertical electrical field $E_v$ is shown at 232. The vertical electric field $E_v$ is dependent upon the value of the gate voltage $V_g$ applied to the control gate 212 and the voltage $V_{pwell}$ applied to the p well 202. Therefore, the vertical electrical field $E_v$ can be affected by changing either the gate voltage $V_g$ or the well voltage $V_{pwell}$ independently or by changing both at the same time.

Figure 2B:
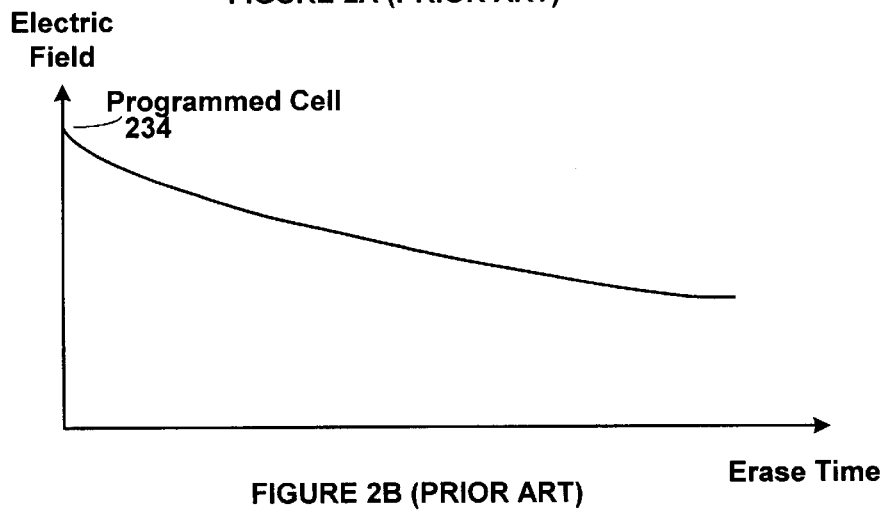
FIG. 2B is a graph illustrating the relationship between the electric field and the erase time of a memory cell.

FIG. 2B is a graph of the vertical electric field across a cell such as the one shown and described in FIG. 2A versus erase time. When the erasure procedure begins the electric field is highest across a programmed cell shown at 234. As the cell becomes erased the electric field decreases. The high electric field causes reliability problems while the relatively low electric field at the end of erase slows the erase.

Figure 2C:
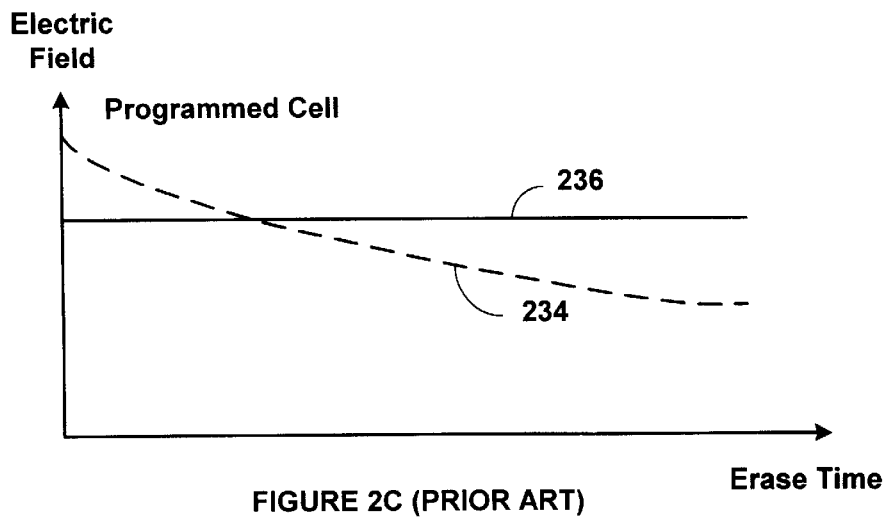
FIG. 2C is graph illustrating the difference between the relationship shown in FIG. 2B and ideal electric field during erase of a memory cell.

FIG. 2C is a graph of the vertical electrical field across a cell such as the one shown and describe in FIG. 2A and shows the graph as shown in FIG. 2B as dashed line 234 and with an optimized vertical electrical field as solid line 236. The optimized vertical electrical field curve 236 is determined during a pre-characterization procedure and is selected to minimize reliability problems and to minimize the reduction of the erase speed. The pre-characterization procedure determines the optimized curve by empirical methods or by computer simulation.

Figure 3A:
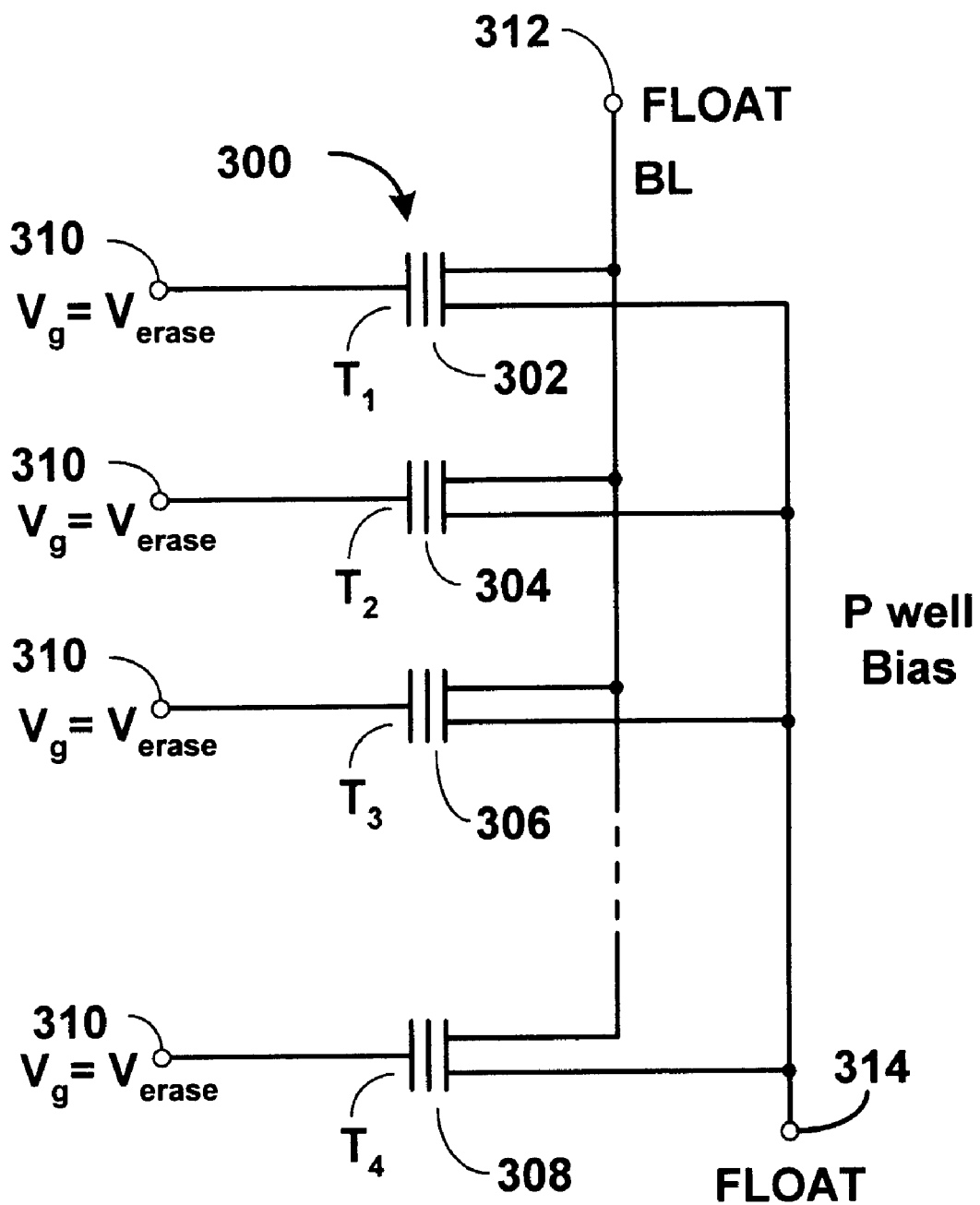
FIG. 3A is a simplified electrical schematic diagram of a column of flash EEPROM cells showing the control gate, source and drain voltages during erase of the cells in the column.

FIG. 3A is a simplified electrical schematic diagram of a column 300 of flash EEPROM cells 302, 304, 306 and 308 and shows a method of erasing the column 300 of cells. A gate voltage $V_g = V_{erase}$ of approximately minus 10 volts is applied to the terminals 310 attached to the control gate of the cells 302, 304, 306 and 308. The bitline BL 312 is floated, the source terminal 314 is allowed to float and the P-well is biased at a voltage from 0 to 5V.

Figure 3B:
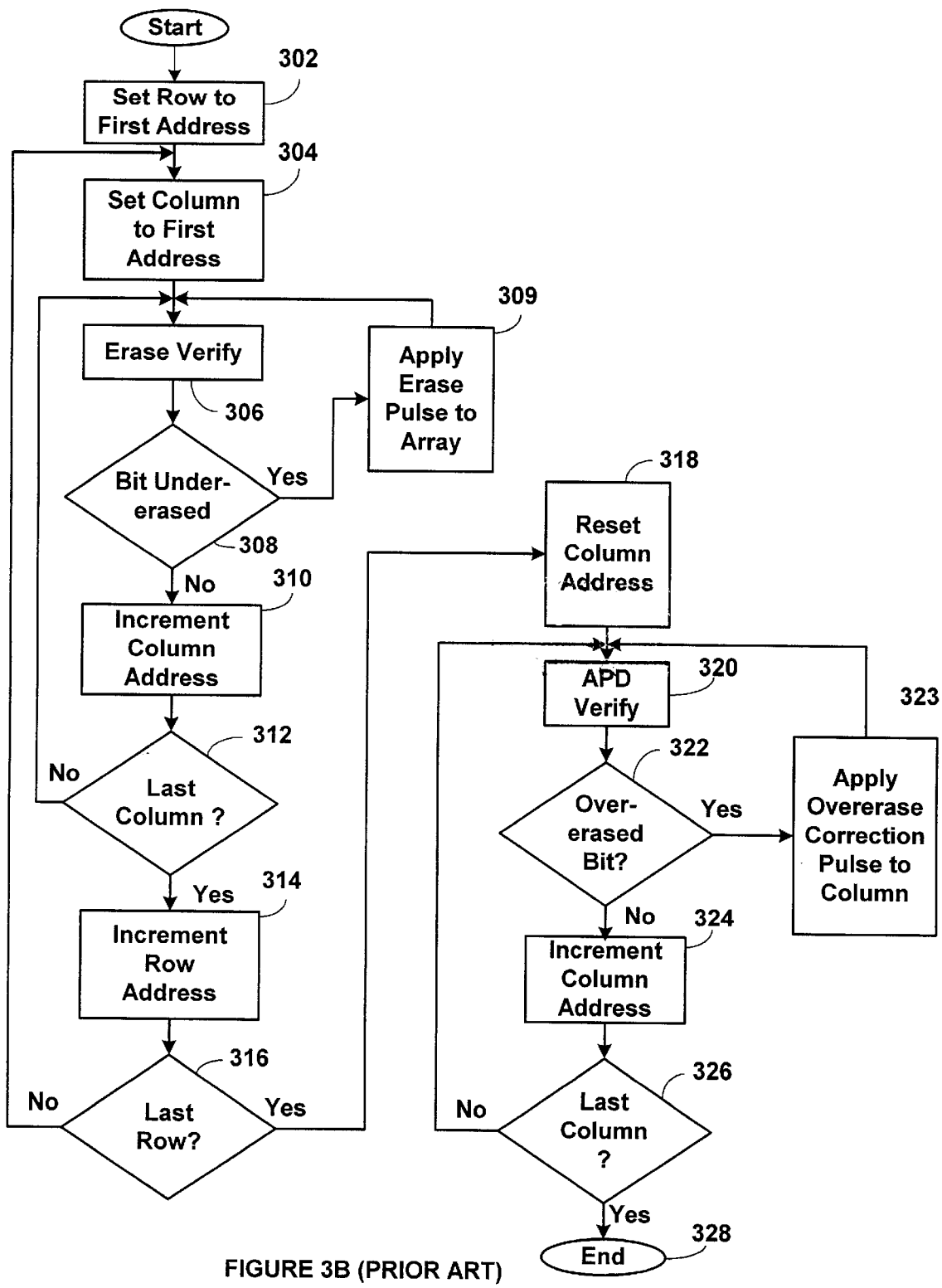
FIG. 3B is a flowchart of a typical erase and overerase correction method as known in the prior art.

FIG. 3B is a flowchart illustrating an erase and overerase correction procedure that can be used to erase the column of cells as shown in FIG. 3A. In the procedure, erase is performed first and then overerase correction is provided.

First, for the erase procedure, in steps 302 and 304, the row address and column address provided by the controller 108 (FIG. 1) are set to an initial address. Next, in steps 306 and 308, an erase verify pulse is provided to a cell as selected by the row and column addresses. If the cell is undererased, an erase pulse is applied in step 309 to the entire array and the erase verify steps 306 and 308 are repeated.

If the cell referred to by the row and column addresses is determined to not be undererased in steps 306 and 308, the column address is incremented in step 310. Next, in step 312, if the last column address has not been exceeded, control returns to step 306. Otherwise, in step 314 the row address is incremented, and if the last row address has not been exceeded in step 316, control is returned to step 304. If the last row has been exceeded, the column address is reset in step 318 to begin the overerase correction procedure.

Next, in the overerase correction procedure, in steps 320 and 322, power supply 106 (FIG. 1) is controlled to provide an overerase verify pulse to the bitline of the cells referred to by the column address, while the wordlines remain grounded. If it is determined that a bitline is carrying a leakage current, one or more overerased cells exist on that bitline, so in step 323 power supply 106 is controlled to provide an overerase correction pulse to all of the cells connected to the bitline referred to by the column address and step 320 is then repeated.

The overerase correction pulse applied in step 323 is a relatively high voltage applied to the drain of a cell, such as 6 volts, while its gate and source are typically grounded. U.S. Pat. No. 5,359,558 entitled "Flash EEPROM Array With Improved High Endurance," incorporated herein by reference discloses further details regarding application of overerase correction pulses.

If no bitline leakage current is identified in step 322, the column address is incremented in step 324. Next, in step 326, if the last column address has not been exceeded, control is returned to step 320. Otherwise, the overerase correction procedure is complete as indicated at 228.

Figure 4A:
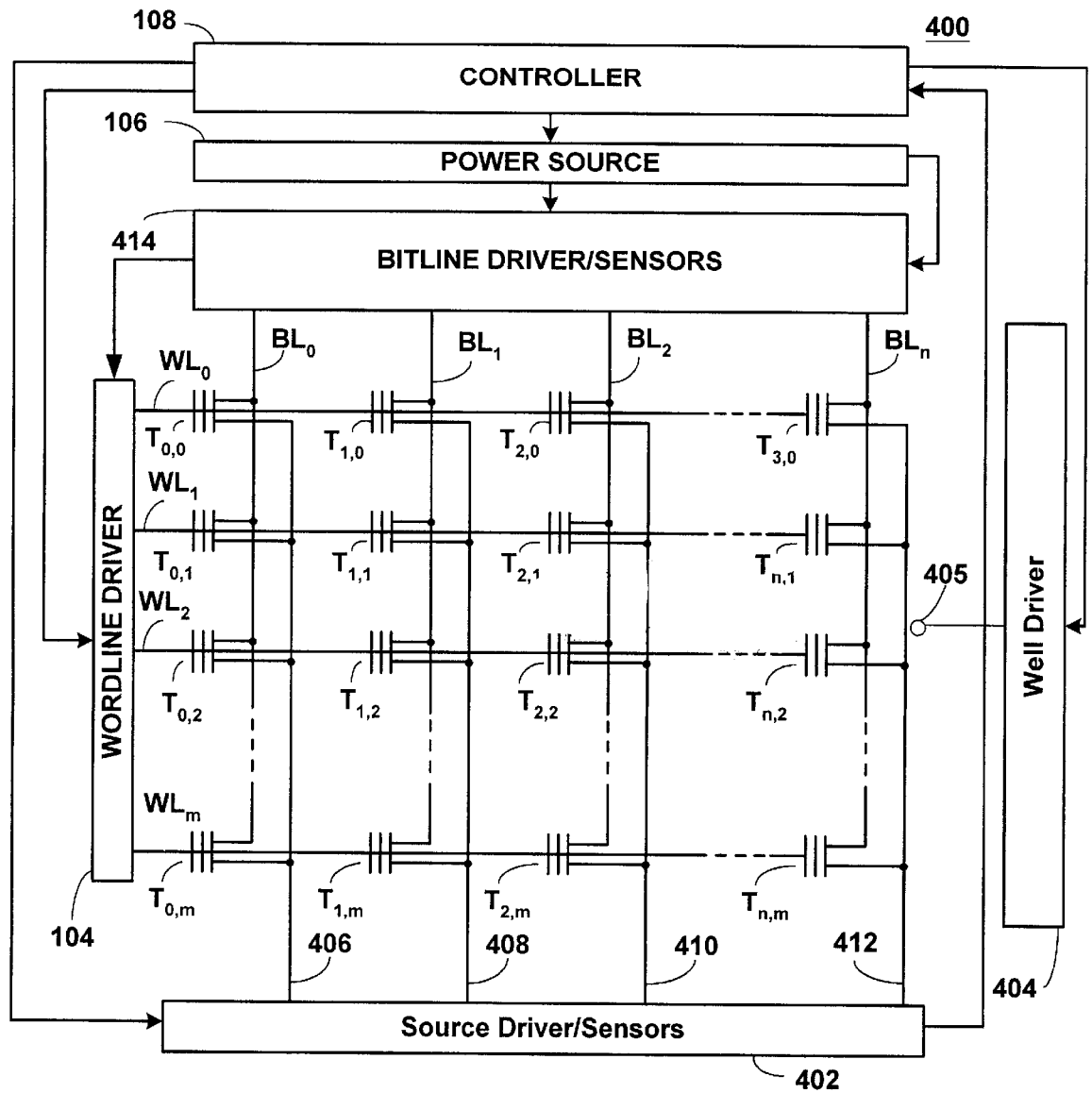
FIG. 4A is a simplified electrical schematic diagram of a flash EEPROM memory device in accordance with the present invention.

FIG. 4A is a simplified electrical schematic diagram of a flash EEPROM memory device 400 in accordance with the present invention. Note that the memory device 400 is similar to the flash EEPROM memory device 100 shown in FIG. 1A. The memory device 400 includes all of the elements shown in the device 100 shown in FIG. 1A plus source driver/sensors element 402 and well driver 404. As will be discussed below, the sources of cells in a column are connected to the source driver/sensor element 402. The source driver/sensor element 402 can sense the current in each of the source lines, 406, 408, 410 & 412 and can apply a voltage to each source line or all of the source lines as directed by the controller 108. Similarly, well driver 404 applies a voltage to the wells via terminal 405 as directed by the controller 108. Bitline Driver/Sensors element 414 can sense the current or voltage in each of the bitlines $BL_0$ through $BL_n$. The Bitline Driver/Sensors element 414 can also apply a voltage to each of the bitlines $BL_0$ through $BL_n$ either individually or collectively as directed by the controller 108. As should be appreciated, an on-chip processor programmed to carry out the various functions of the flash memory device 400 controller 108.

Figure 4B:
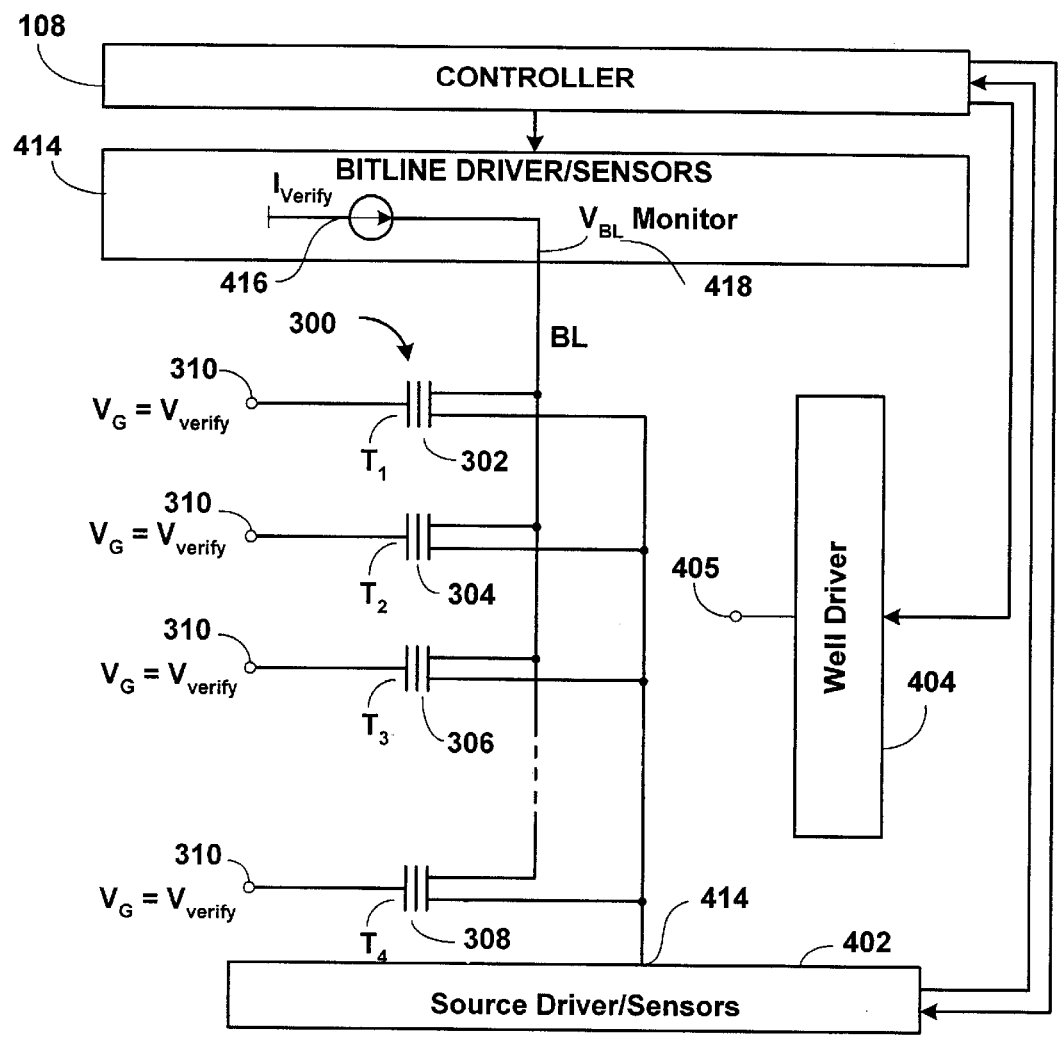
FIG. 4B is a simplified electrical schematic diagram of a column of flash EEPROM cells showing the control gate, source and drain connections in accordance with the present invention.
Figure 4C:
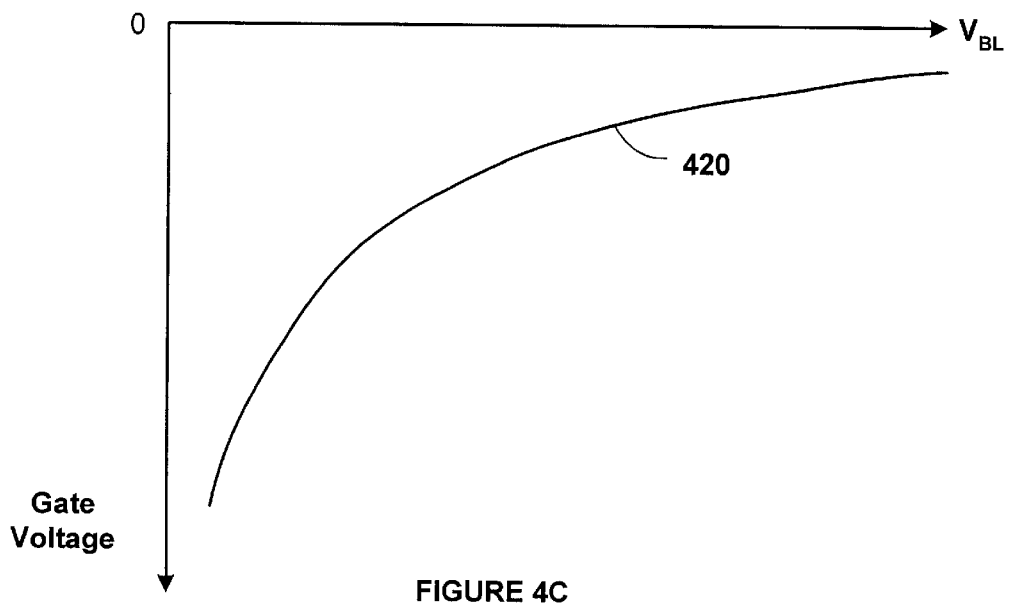
FIG. 4C illustrates an example of the relationship of the bitline voltage $V_{BL}$ and the gate voltage.

FIG. 4B is a simplified electrical schematic diagram of the column 300 of flash EEPROM cells 302, 304, 306, and 308 shown in FIG. 3A. The column 300 of flash EEPROM cells are configured as shown in FIG. 4A with the Bitline Driver/Sensors element 414 and the Source Driver/Sensors element 402. In accordance with one embodiment of the present invention, during the erase verify phase (to be discussed below in conjunction with FIG. 4D) the gates of the cells 302, 304, 306 and 308 are biased to a small negative voltage $V_G = V_{verify}$ sufficient to cause band-to-band current with the applied reverse bias across the drain to well junction. A drain voltage on a selected bitline BL for a given band-to-band (BTB) current is measured. The relationship between the measured band-to-band current and the state of erasure is determined during the pre-characterization procedure. The current in the selected bitline is measured by a current sensor 416 in the Bitline Driver/Sensors element 414 and the voltage $V_{BL}$ is measured by the $V_{BL}$ monitor 418. This information is fedback to the controller 108, which adjusts the vertical electrical field for the next erase pulse by adjusting either the erase gate voltage $V_G = V_{erase}$ for the next erase pulse or by adjusting the p-well bias for the next pulse or by adjusting both, for example by making the gate voltage more negative and by making the p-well voltage more positive or by making the gate voltage less negative and by making the p-well voltage less positive. The optimal erase gate voltage $V_{erase}$ for the next erase is determined during the pre-characterization procedure, in which it is determined, either by computer modeling or by an empirical characterization procedure what the optimal next gate erase pulse should be. FIG. 4C illustrates an example of the relationship of the $V_{BL}$ and the gate voltage 420. The gate voltage $V_G$ is decreased as the measured $V_{BL}$ decreases. The exact relationship is determined during the pre-characterization procedure.

Figure 4D:
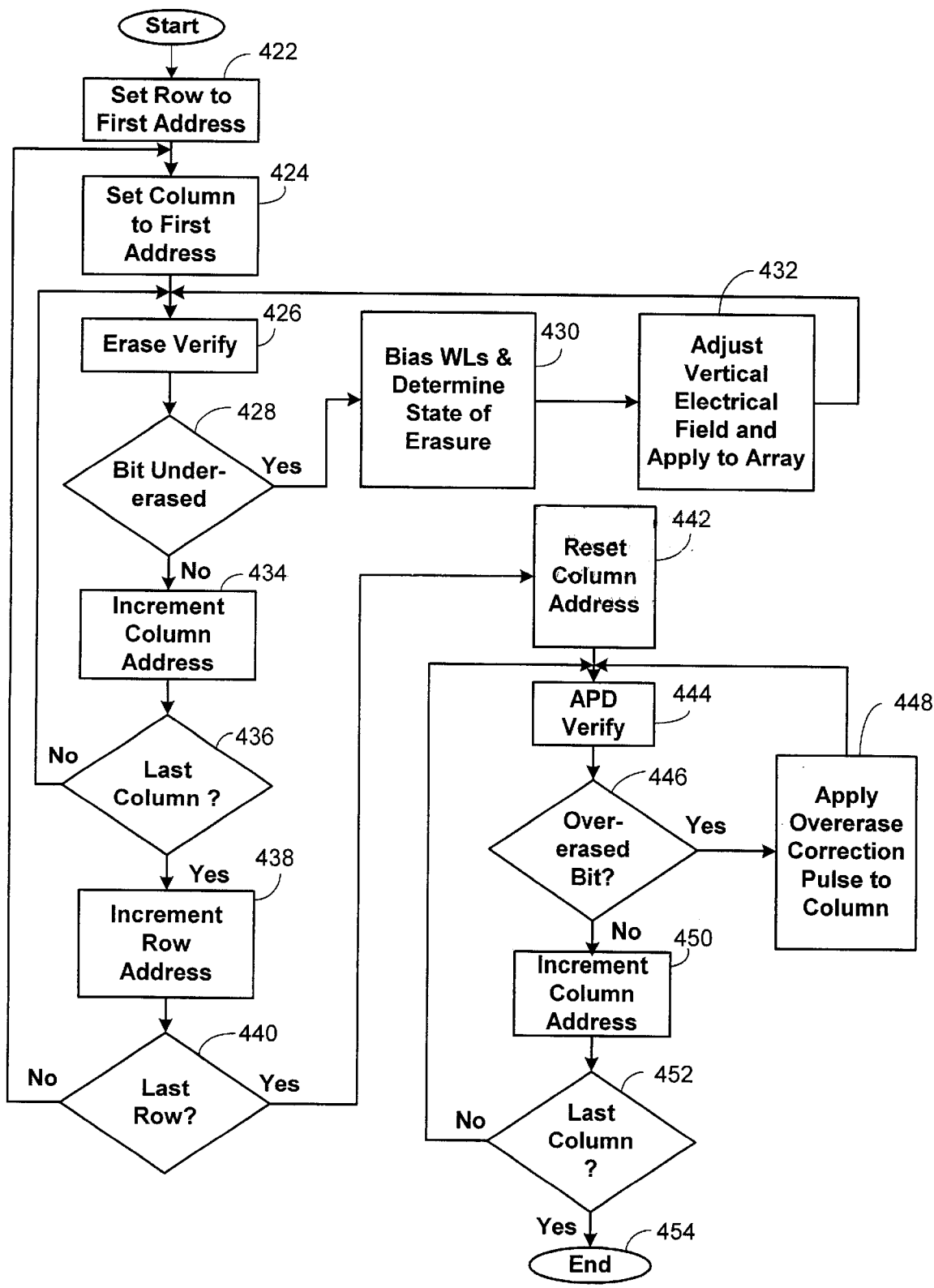
FIG. 4D is a flowchart illustrating an erase and overerase correction methodology that includes a methodology of determining the state of erasure that can be used for flash devices that include the column of cells as shown in FIG. 4B.

FIG. 4D is a flowchart illustrating an erase and overerase correction methodology that can be used to erase flash devices that includes the column of cells 300 as shown in FIG. 4B. In the procedure, erase is performed first and an erase verify procedure is done followed by a methodology of determining the state of erasure of the cells being erased. After the state of erasure of the cells being erased is determined, the gate voltage to be applied during the next erase pulse is adjusted.

First, for the erase procedure, in steps 422 and 424, the row address and column address provided by the controller 108 (FIG. 1) is set to an initial address. Next, in steps 426 and 428, an erase verify pulse is provided to a cell as selected by the row and column addresses. If the cell is undererased, the wordlines are biased and the state of erasure is determined at 430, the vertical electrical field is adjusted and applied in step 432 to the entire array and the erase verify steps 426 and 428 are repeated.

If the cell referred to by the row and column addresses is determined to not be undererased in steps 426 and 428, the column address is incremented in step 434. Next, in step 436, if the last column address has not been exceeded, control returns to step 426. Otherwise, in step 438 the row address is incremented, and if the last row address has not been exceeded in step 440, control is returned to step 426. If the last row has been exceeded, the column address is reset in step 442 to begin the overerase correction procedure.

Next, in the overerase correction procedure, in steps 444 and 446, power supply 106 (FIG. 4A) is controlled to provide an overerase verify pulse to the bitline of the cells referred to by the column address, while wordlines remain grounded. If is determined that a bitline is providing a leakage current, one or more overerased cells exist in that bitline, so in step 448 power supply 106 is controlled to provide an overerase correction pulse to all of the cells connected to the bitline referred to by the column address and step 444 is then repeated.

The overerase correction pulse applied in step 448 is a relatively high voltage applied to the drain of a cell, such as 6 volts, while its gate and source are typically grounded. U.S. Pat. No. 5,359,558 entitled "Flash EEPROM Array With Improved High Endurance," incorporated herein by reference discloses further details regarding application of overerase correction pulses.

If no bitline leakage current is identified in step 446, the column address is incremented in step 450. Next, in step 452, if the last column address has not been exceeded, control is returned to step 444. Otherwise, the overerase correction procedure is complete as indicated at 454.

In accordance with a second embodiment of the present invention, the source BTB current or voltage for the entire sector can be monitored to determine the state of erasure during the verify period. Referring again to FIGS. 4A & 4B, the state of erasure of the sector 400 shown in FIG. 4A can be determined by monitoring the source BTB current or voltage for the sector 400. Referring to FIG. 4B, the source BTB current or voltage for the entire sector is monitored by the Source Driver/Sensors element 402 and the monitored information is sent to the controller 108, which, in turn, controls the voltage applied to the wordlines by the wordline driver 104, FIG. 4A for the next erase pulse applied to the entire sector 400.

In accordance with a third embodiment of the present invention, the source BTB current or voltage can also be measured during the erase period. Referring to FIGS. 4A & 4B, the state of erasure of the sector 400, FIG. 4A, or the column 300, FIG. 4B can be determined during the erase phase (discussed below in FIG. 5A). This is accomplished during the erase phase by causing the Source Drivers/Sensors element to bias the source above the well voltage applied by the well driver 404. The controller 108 controls both the Well Driver 404 and the Source Driver/Sensors element 402 (FIG. 4B).

Figure 5:
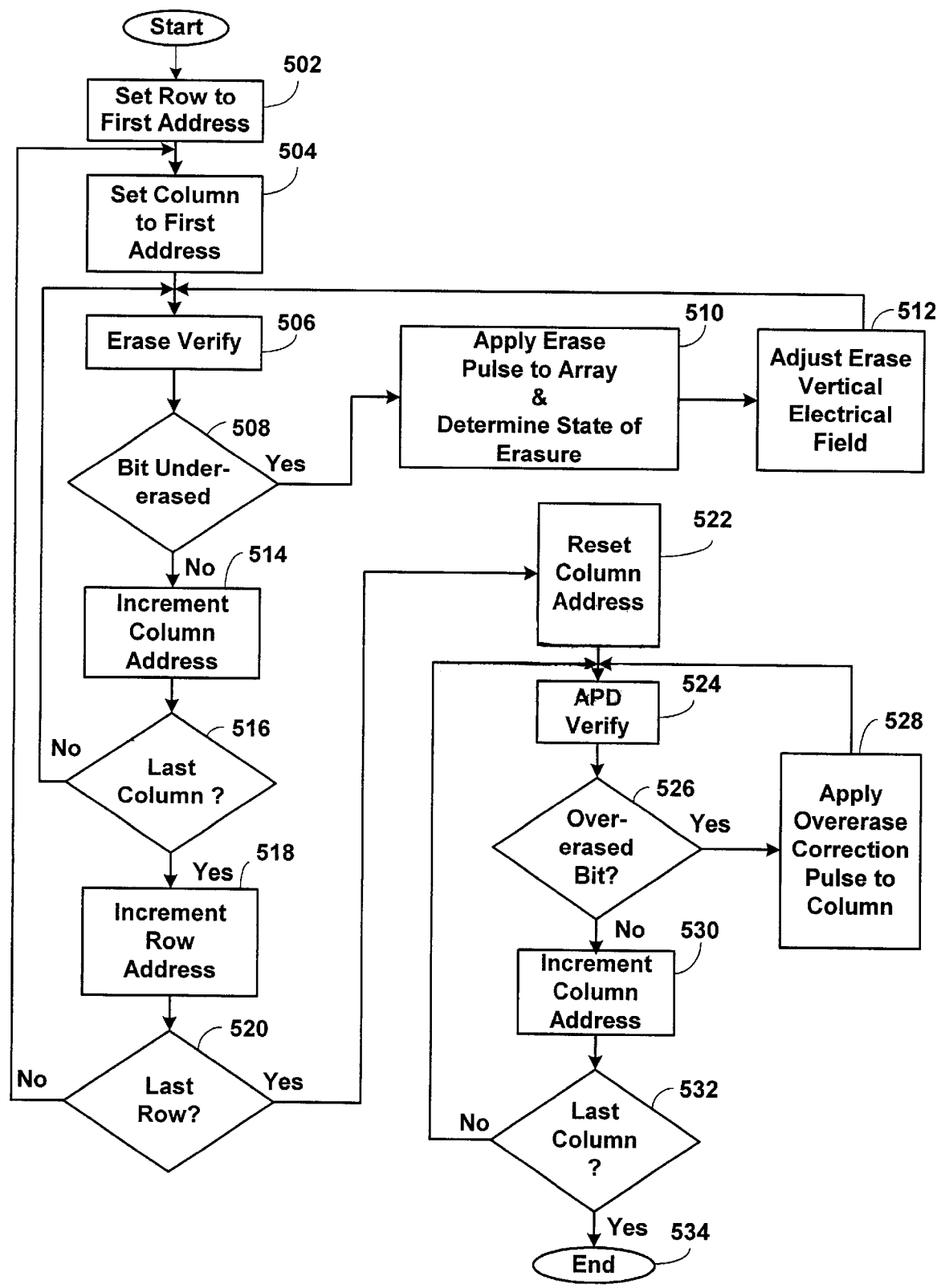
FIG. 5 is a flowchart illustrating an alternative erase and overerase correction methodology that includes a methodology of determining the state of erasure that can be used for flash devices that includes the column of cells as shown in FIG. 4B.

FIG. 5 is a flowchart illustrating an erase and overerase correction procedure that can be used to erase a flash device that includes the column of cells 300 as shown in FIG. 4B. In the procedure, erase is performed first and an erase verify procedure is done that incorporates a methodology of determining the state of erasure of the cells being erased. After the state of erasure of the cells being erased is determined, the gate voltage to be applied during the next erase pulse is adjusted.

First, for the erase procedure, in steps 502 and 504, the row address and column address provided by the controller 108 (FIG. 1) are set to an initial address. Next, in steps 506 and 508, an erase verify pulse is provided to a cell as selected by the row and column addresses. If the cell is undererased, an erase pulse is applied to the array and the state of erasure is determined at 510, the erase vertical electrical field is adjusted and applied in step 512 to the entire array and the erase verify steps 506 and 508 are repeated. The state of erasure is determined by biasing the source above the well voltage and measuring either the source BTB current or voltage. The gate voltage can be adjusted dynamically during the erase procedure.

If the cell referred to by the row and column addresses is determined to be not undererased in steps 506 and 508, the column address is incremented in step 514. Next, in step 516, if the last column address has not been exceeded, control returns to step 506. Otherwise, in step 518 the row address is incremented, and if the last row address has not been exceeded in step 520, control is returned to step 506. If the last row has been exceeded, the column address is reset in step 522 to begin the overerase correction procedure.

Next, in the overerase correction procedure, in steps 524 and 526, power supply 106 (FIG. 4A) is controlled to provide an overerase verify pulse to the bitline of the cells referred to by the column address, while the wordlines remain grounded. If is determined that a bitline is providing a leakage current, one or more overerased cells exist in that bitline, so in step 528 power supply 106 is controlled to provide an overerase correction pulse to all of the cells connected to the bitline referred to by the column address and step 524 is then repeated.

The overerase correction pulse applied in step 528 is a relatively high voltage applied to the drain of a cell, such as 6 volts, while its gate and source are typically grounded. U.S. Pat. No. 5,359,558 entitled "Flash EEPROM Array With Improved High Endurance," incorporated herein by reference discloses further details regarding application of overerase correction pulses.

If no bitline leakage current is identified in step 526, the column address is incremented in step 530. Next, in step 532, if the last column address has not been exceeded, control is returned to step 524. Otherwise, the overerase correction procedure is complete as indicated at 534.

Figure 6A:
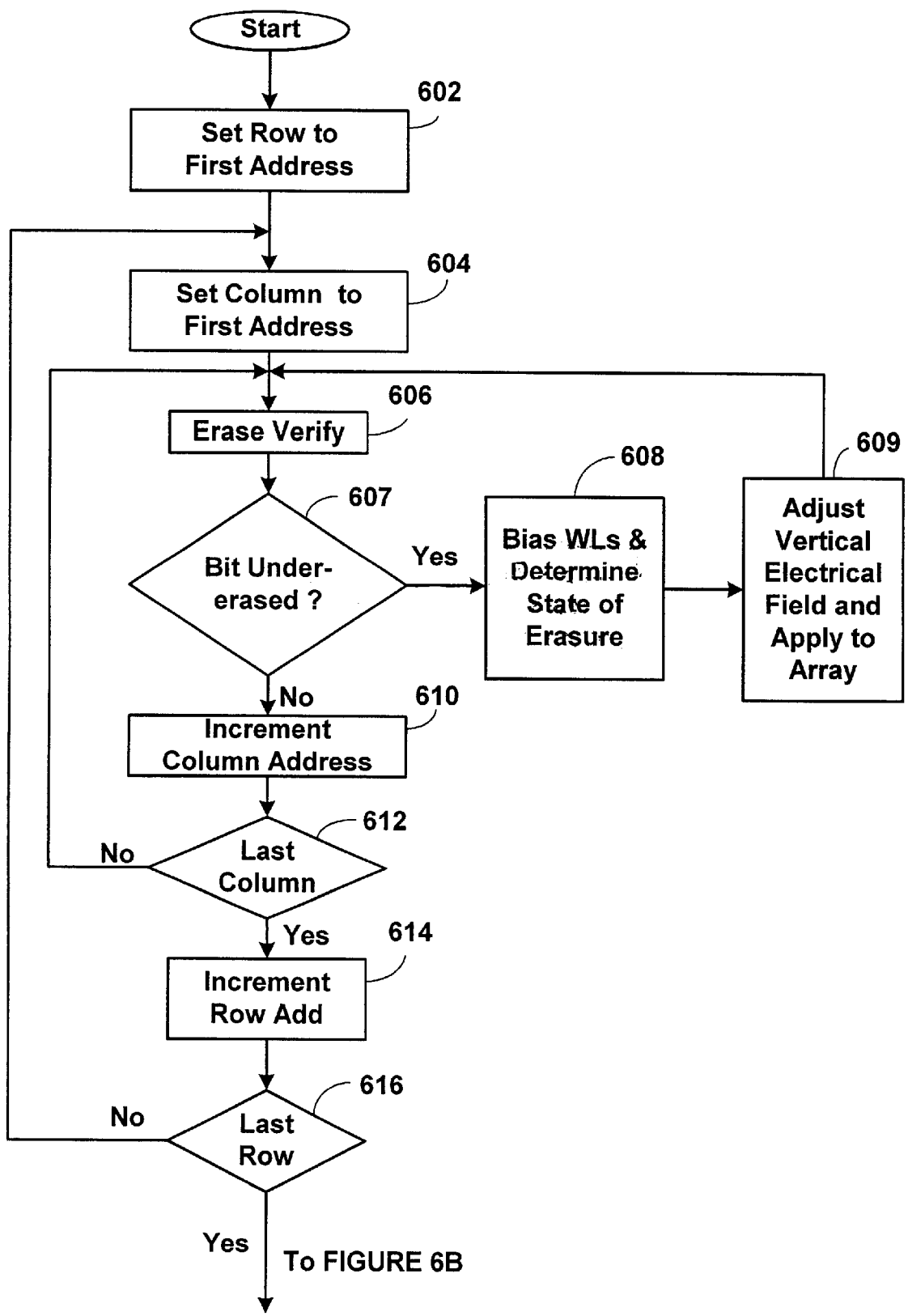
FIGS. 6A–6C is a flowchart illustrating a bit-by-bit APDE verify erase and overerase correction methodology that includes a methodology of determining the state of erasure in accordance with the present invention.
Figure 6B:
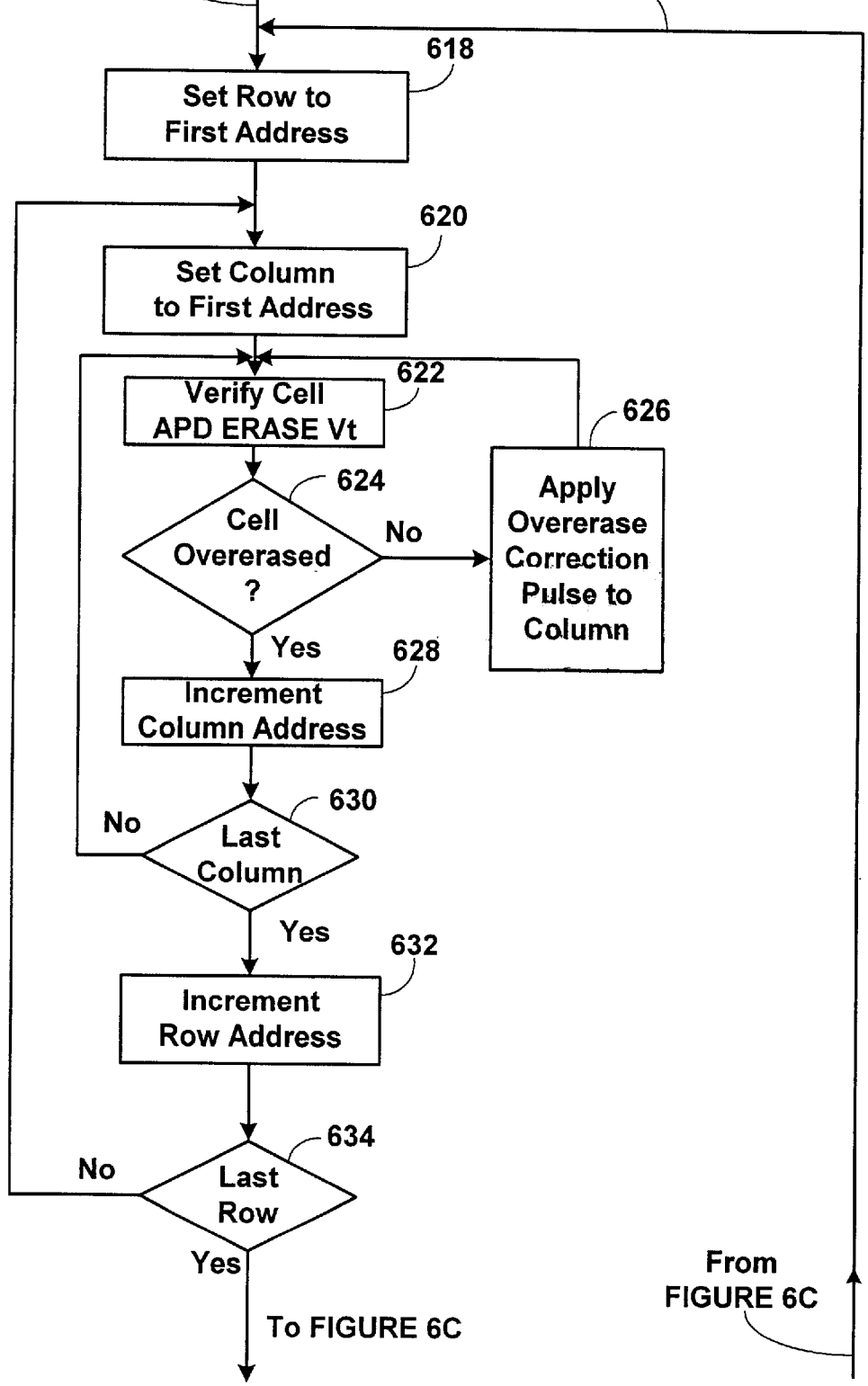
Figure 6C:
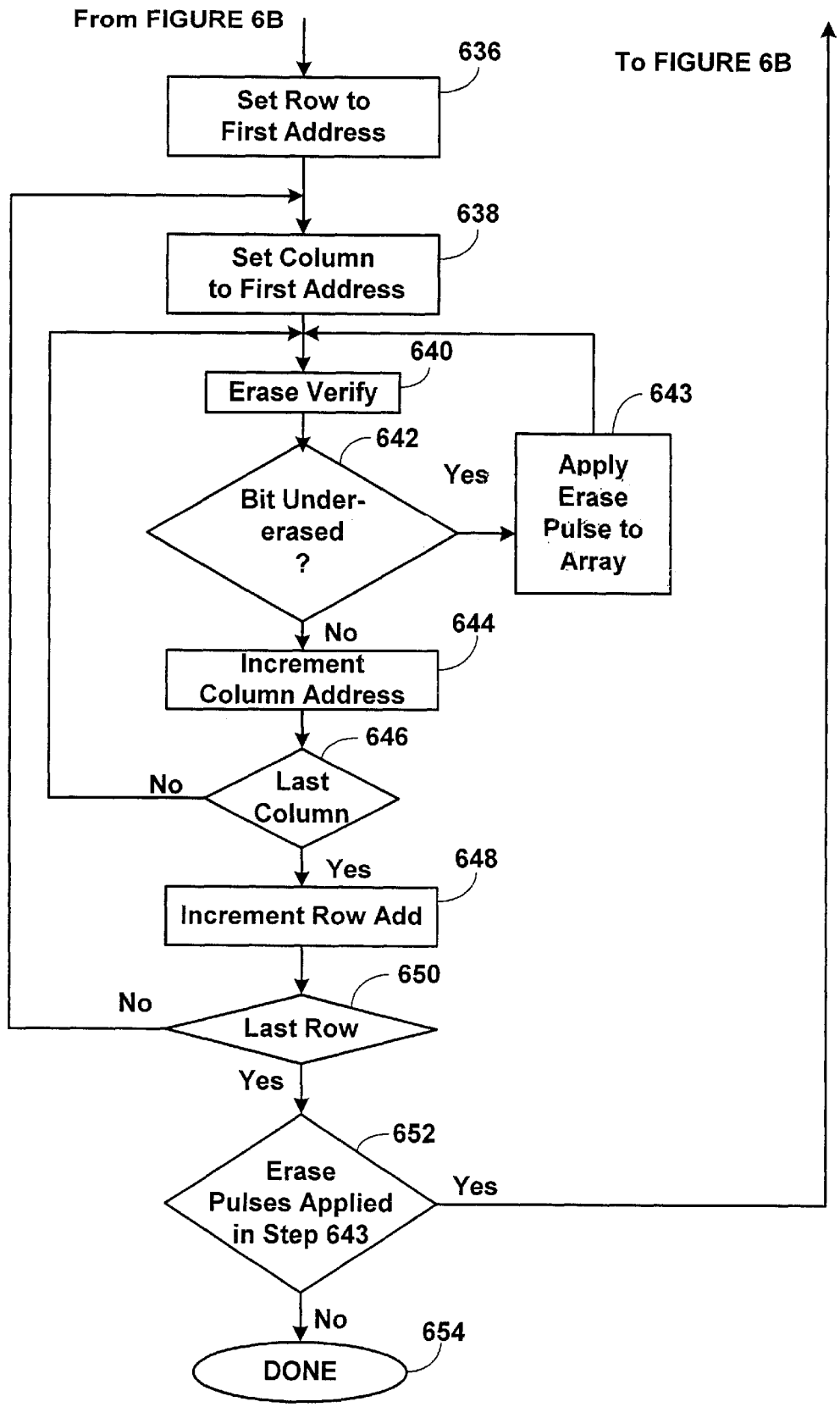

FIGS. 6A through 6C show a flow chart of an erase and overerase correction method including a methodology of determining the state of erasure in accordance with the present invention. The method of the present invention is an erase procedure followed by an overerase correction procedure with a second erase procedure. The overerase correction procedure checks each bit, bit-by-bit, in the memory array for overerasure. After each determination of an undererased bit, the wordlines are biased and a determination of the state of erasure is made and the vertical electrical field is adjusted and applied to the array.

First, for the initial erase procedure, in steps 602 and 604, the row address and column address are set to an initial address. Next in steps 606 and 607, an erase verify pulse is provided to a cell as selected by the row and column addresses and a determination is made if the cell is undererased. If the cell is undererased, the wordlines are biased and the state of erasure is determined at 608, the vertical electrical field is adjusted and is applied to the array at 609, and the erase verify steps 606 and 607 are repeated.

If the cell referred to by the row and column addresses is determined to not be undererased in steps 606 and 607, the column address is incremented in step 610. Next, in step 612, if the last column address has not been exceeded, control returns to step 606. Otherwise, in step 614 the row address is incremented, and if the last row address has not been exceeded in step 616, control is returned to step 606. If the last row has been exceeded, the overerase correction procedure is initiated.

The overerase correction procedure is shown in FIG. 6B. In steps 618 and 620, the row address and column address are set to an initial address. Next, in the overerase correction procedure, in steps 622 and 624, power supply 102 (FIG. 1A) is controlled to provide an overerase verify pulse to the bitline referred to by the column address. In addition, the wordline driver 104 (FIG. 1A) provides a gate voltage to the wordline referred to by the row address and grounds the unselected wordlines. The gate voltage of the bit being verified is set high enough to far exceed the current contribution of the unselected bits on the column. The benefit of this is that a large differential in current between the selected bit and the unselected bits on the bitline allows a reliable determination of the threshold voltage, $V_t$, of the cell being verified. If it is determined at 624 that the threshold voltage, $V_t$, of the bit being verified is below the minimum threshold voltage, $V_t$min, an overerase correction pulse is applied at 626 to the bitline referred to by the column address. If it is determined at 624 that the threshold voltage, $V_t$, of the bit being verified is still below the minimum threshold voltage, $V_t$min, another overerase correction pulse is applied at 626. This procedure is repeated until it is determined at 624 that the threshold voltage, $V_t$, of the bit being verified is above the minimum threshold voltage $V_t$min, at which point the column address is incremented at 628.

Next, in step 630, if the last column address has not been exceeded, control returns to step 622. Otherwise, in step 632 the row address is incremented, and if the last row address has not been exceeded in step 634, control is returned to step 620. If the last row has been exceeded, the next erase verify procedure is initiated.

The next erase verify procedure is shown in FIG. 6C. In steps 636 and 638, the row address and column address are set to an initial address. Next in steps 640 and 642, an erase verify pulse is provided to a cell as selected by the row and column addresses. If the cell is undererased an erase pulse is applied in step 643 to the entire array and the erase verify steps 640 and 642 are repeated.

If the cell referred to by the row and column addresses is determined to not be undererased in steps 640 and 642, the column address is incremented in step 644. Next, in step 646, if the last column address has not been exceeded, control returns to step 640. Otherwise, in step 648 the row address is incremented, and if the last row address has not been exceeded in step 650, control is returned to step 638. If the last row has been exceeded, it is determined at 652 if there were undererased bits determined at step 642 which necessitated the application of an erase pulse or erase pulses at step 643. If there has been the application of erase pulses at step 643 there may be memory cells that are now overerased and it is necessary to perform an overerase verify procedure. Therefore, if erase pulses have been applied to the memory array, control of the process is returned to step 618 (FIG. 6B) and an overerase verify procedure is conducted. In case the threshold voltages of a few bits shifted to lower than $V_t$min during the erase cycle, overerase correction is needed. If it is determined at step 652 that there were no erase pulses applied in step 643, the process is done as indicated at 654. It is contemplated that in most cases only one erase and overerase cycle will be needed.

Figure 7A:
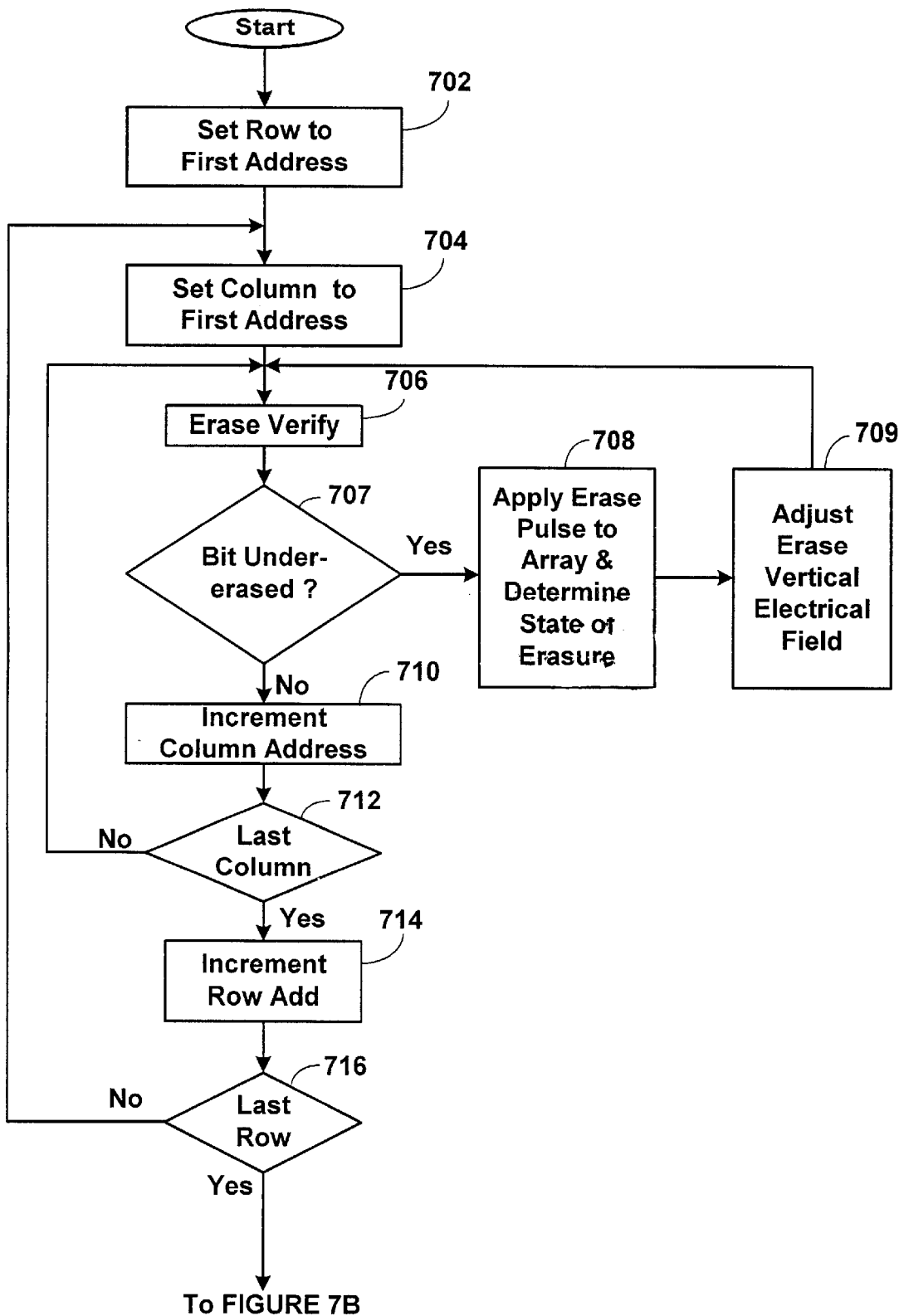
FIGS. 7A—7C is a flowchart illustrating a bit-by-bit APDE verify erase and overerase correction methodology that includes an alternate methodology of deter mining the state of erasure in accordance with the present invention.
Figure 7B:
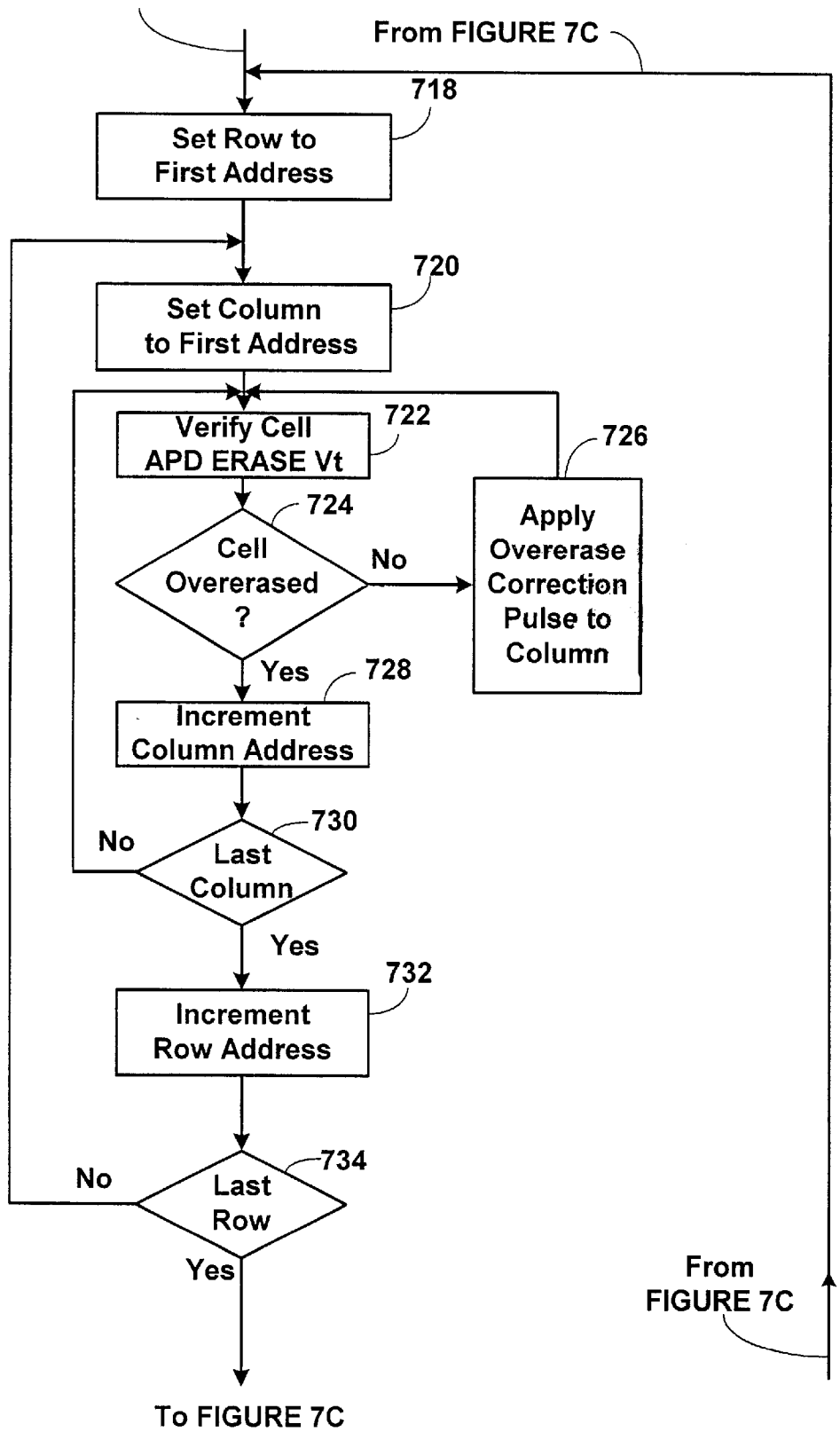
Figure 7C:
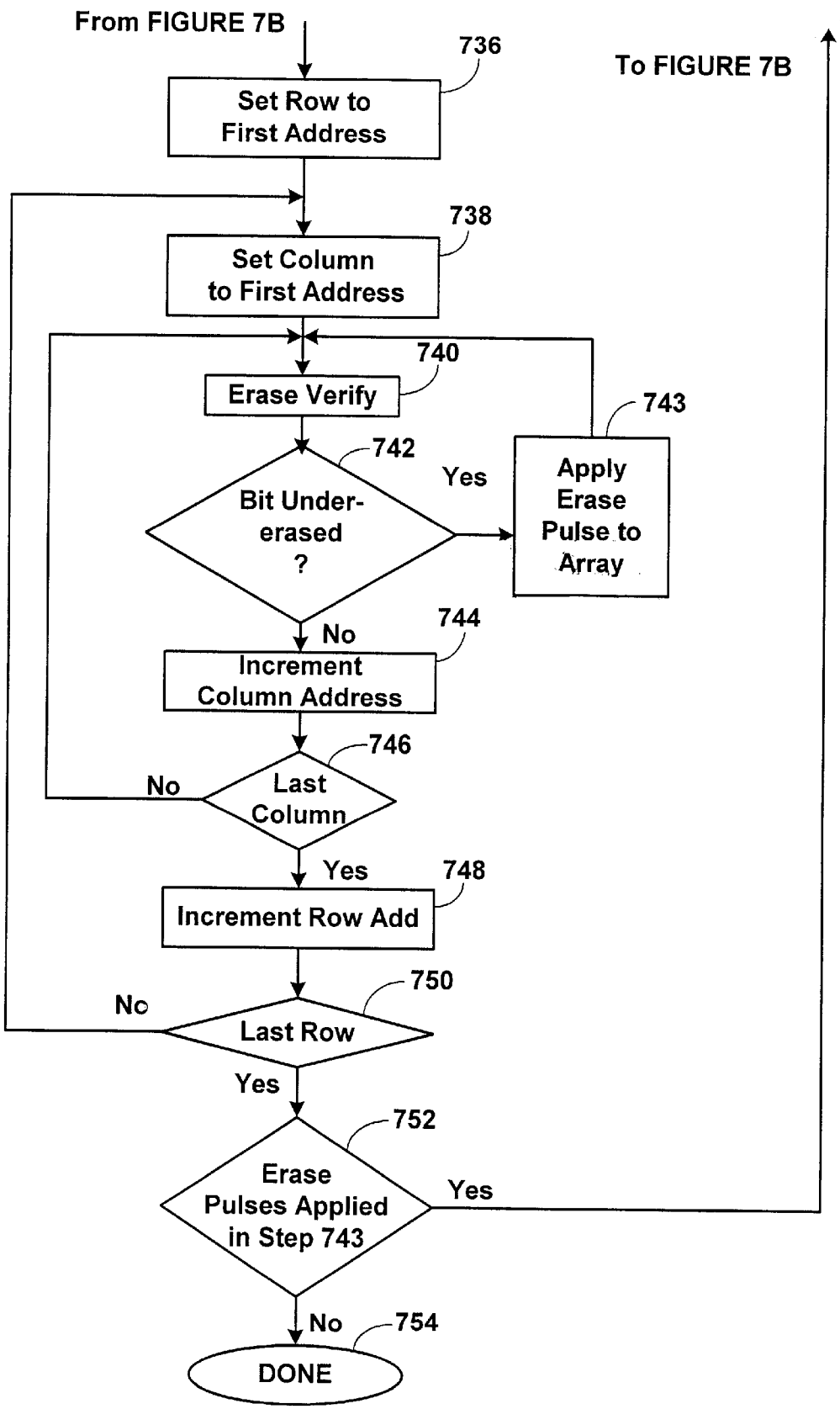

FIGS. 7A through 7C show a flow chart of an erase and overerase correction method including a methodology of determining the state of erasure in accordance with the present invention. The method of the present invention is an erase procedure followed by an overerase correction procedure with a second erase procedure. The overerase correction procedure checks each bit, bit-by-bit, in the memory array for overerasured bits. After each determination of an undererased bit, an erase pulse is applied to the array and the state of erasure is determined and the vertical electrical field is adjusted.

First, for the initial erase procedure, in steps 702 and 704, the row address and column address are set to an initial address. Next in steps 706 and 707, an erase verify pulse is provided to a cell as selected by the row and column addresses and a determination is made if the cell is undererased. If the cell is undererased, an erase pulse is applied and the state of erasure is determined at 708, the vertical electrical field is adjusted either dynamically or for the next pulse at 709, and the erase verify steps 706 and 707 are repeated.

If the cell referred to by the row and column addresses is determined to not be undererased in steps 706 and 707, the column address is incremented in step 710. Next, in step 712, if the last column address has not been exceeded, control returns to step 706. Otherwise, in step 714 the row address is incremented, and if the last row address has not been exceeded in step 716, control is returned to step 706. If the last row has been exceeded, the overerase correction procedure is initiated.

The overerase correction procedure is shown in FIG. 7B. In steps 718 and 720, the row address and column address are set to an initial address. Next, in the overerase correction procedure, in steps 722 and 724, power supply 102 (FIG. 1A) is controlled to provide an overerase verify pulse to the bitline referred to by the column address. In addition, the wordline driver 104 (FIG. 1A) provides a gate voltage to the wordline referred to by the row address and grounds the unselected wordlines. The gate voltage of the bit being verified is set high enough to far exceed the current contribution of the unselected bits on the column. The benefit of this is that a large differential in current between the selected bit and the unselected bits on the bitline allows a reliable determination of the threshold voltage, $V_t$, of the cell being verified. If it is determined at 724 that the threshold voltage, $V_t$, of the bit being verified is below the minimum threshold voltage, $V_t$min, an overerase correction pulse is applied at 726 to the bitline referred to by the column address. If it is determined at 724 that the threshold voltage, $V_t$, of the bit being verified is still below the minimum threshold voltage, $V_t$min, another overerase correction pulse is applied at 726. This procedure is repeated until it is determined at 724 that the threshold voltage, $V_t$, of the bit being verified is above the minimum threshold voltage $V_t$min, at which point the column address is incremented at 728.

Next, in step 730, if the last column address has not been exceeded, control returns to step 722. Otherwise, in step 732 the row address is incremented, and if the last row address has not been exceeded in step 734, control is returned to step 720. If the last row has been exceeded, the next erase verify procedure is initiated.

The next erase verify procedure is shown in FIG. 7C. In steps 736 and 738, the row address and column address are set to an initial address. Next in steps 740 and 742, an erase verify pulse is provided to a cell as selected by the row and column addresses. If the cell is undererased an erase pulse is applied in step 743 to the entire array and the erase verify steps 740 and 742 are repeated.

If the cell referred to by the row and column addresses is determined to not be undererased in steps 740 and 742, the column address is incremented in step 744. Next, in step 746, if the last column address has not been exceeded, control returns to step 740. Otherwise, in step 748 the row address is incremented, and if the last row address has not been exceeded in step 750, control is returned to step 738. If the last row has been exceeded, it is determined at 752 if there were undererased bits determined at step 742 which necessitated the application of an erase pulse or erase pulses at step 743. If there has been the application of erase pulses at step 743 there may be memory cells that are now overerased and it is necessary to perform an overerase verify procedure. Therefore, if erase pulses have been applied to the memory array, control of the process is returned to step 718 (FIG. 7B) and an overerase verify procedure is conducted. In case the threshold voltages of a few bits shifted to lower than $V_t$min during the erase cycle, overerase correction is needed. If it is determined at step 752 that there were no erase pulses applied in step 743, the process is done as indicated at 754. It is contemplated that in most cases only one erase and overerase cycle will be needed.

Figure 8:
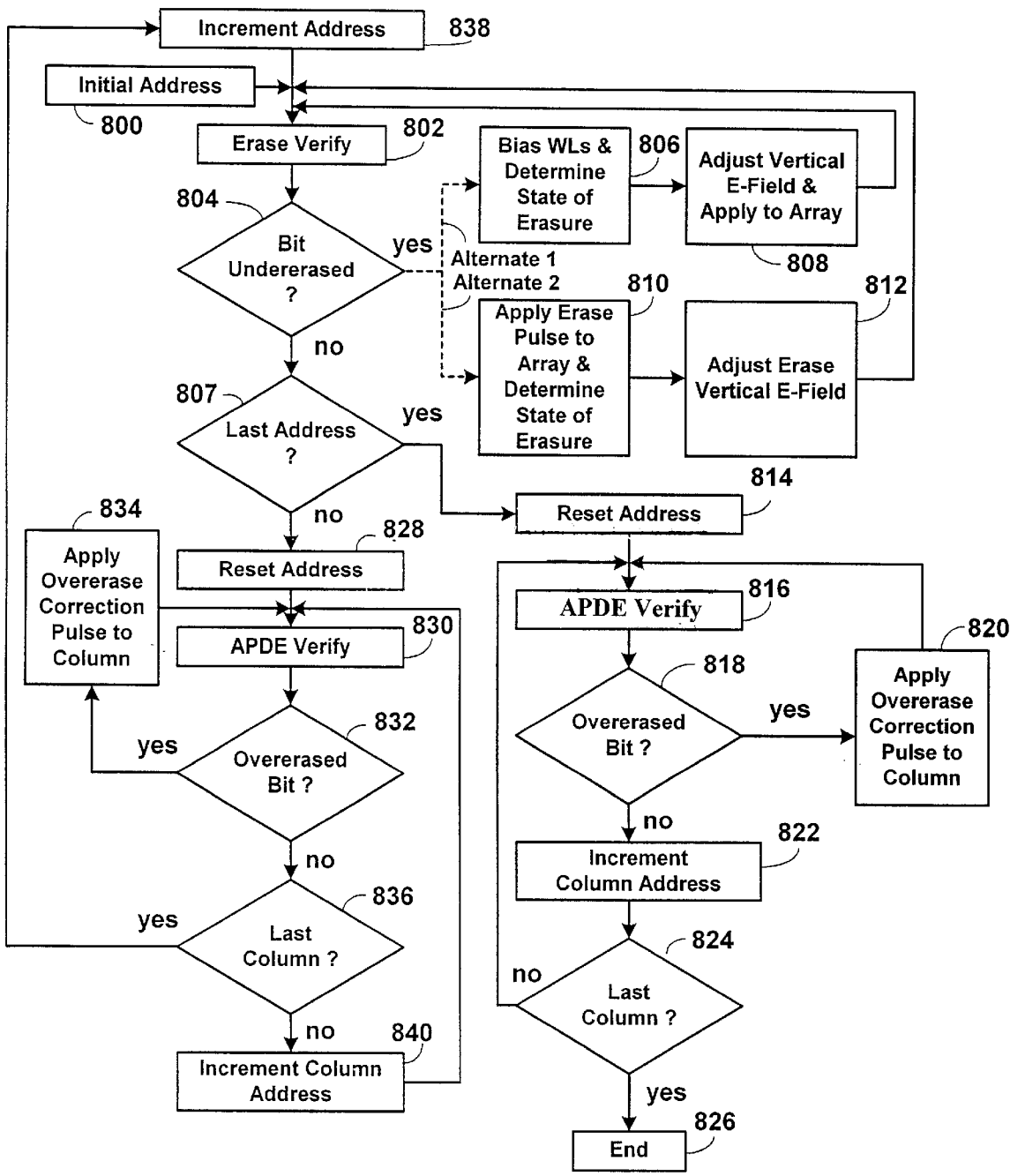
FIG. 8 is a flowchart illustrating an erase methodology including an entire APDE sequence following each erase verify of an individual bit.

FIG. 8 is a flow chart of an erase and overerase correction methodology that performs an entire APDE sequence after each bit is erase verified. The overerase correction procedure checks each bit, bit-by-bit, in the memory array for overerase bits after each bit is erase verified. If there is detected an undererased bit, an erase pulse is applied to the entire array using one of two alternates.

First, for the initial erase procedure, an initial address is set at 800. The bit at the initial address is erase verified at 802. If it is determined at 804 that the bit is undererased, one of two alternates (it should be appreciated that either alternate 1 or alternate 2 is included in the memory array but not both—both alternates are shown in FIG. 8 for purposes of discussion and that one of the alternates would be built into the array but not both) would have been built into the array and would be used to apply an adjusted erase pulse to the array. Alternate 1 is described above in FIG. 6A as follows: If the bit or cell is undererased, the wordlines are biased and the state of erasure is determined at 806, the vertical electrical field is adjusted and is applied to the array at 808 and the erase verify steps 802 and 804 are repeated. Alternate 2 is described above in FIG. 7A as follows: If the bit or cell is undererased, an erase pulse is applied and the state of erasure is determined at 810, the vertical electrical field is adjusted either dynamically during the present pulse or for the next pulse at 812, and the erase verify steps 802 and 804 are repeated.

When or if the bit verifies as not undererased at 804, it is determined at 807 if the bit just verified is the last bit. If it is determined that the bit just verified is the last bit, the address is reset to the initial address at 814 and a complete APDE (overerased bit detection and correction) sequence is done. The first address is overerase verified at 816. If there is an overerased bit in the column detected at 818 an overerase correction pulse is applied to the column at 820 and steps 816 and 818 are repeated until there is no overerased bit in the column. When it is determined at 818 that there is no overerased bit in the column, the column address is incremented at 822 and if it determined at 824 that the column just overerase verified is not the last column, the flow is returned to step 816 and the process continues until all of the columns are APDE verified and as indicated at 826 the process is ended.

If it is determined at 807 that the bit just erase verified is not the last bit, the address is reset to the initial address at 828 and a complete APDE sequence is done. The first address is overerase verified at 830. If there is an overerased bit in the column detected at 832 an overerased correction pulse is applied to the column at 834 and the steps at 830 and 832 are repeated until there is not an overerased bit in the column. It is determined at 836 if the last column has been overerase verified and if not the address is incremented at 838 and the next bit is erase verified and the flow continues from 802. If it is determined at 836 that the last column had not been overerase verified, the column address is incremented at 840 and the flow returns to step 830.

In summary, the present invention provides a method of erasing flash EEPROM cells that increases reliability and minimizes the reduction in erase speed.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of erasing a flash memory device, the method comprising:
   (a) initiating an erase procedure of the flash memory device;
   (b) erase verifying a selected number of memory cells;
   (c) determining state of erasure of the selected number of memory cells if undererased bits are determined during step (b);
   (d) applying an adjusted vertical electrical field to the flash memory device, wherein the adjustment to the vertical electrical field is based upon the state of erasure determined in step (c);
   (e) repeating steps (b) through (d) until it is determined in step (b) that there are no undererased bits in the selected number of memory cells;
   (f) erase verifying a next selected number of memory cells;
   (g) repeating steps (c) through (f) until all of the memory cells in the flash memory device have been erased.

2. The method of claim 1 wherein the state of erasure in step (c) is included in step (b).

3. The method of claim 2 wherein the state of erasure is determined by:
   biasing gates of the flash memory; and
   measuring a drain voltage of a selected column of memory cells for a given band-to-band current in the column.

4. The method of claim 2 wherein the state of erasure is determined by:
   biasing gates of the flash memory; and
   measuring a drain voltage of all columns of memory cells for a given band-to-band current in the columns.

5. The method of claim 1 wherein applying an adjusted vertical electrical field is accomplished by one of the following methods selected from the group including changing gate voltages, changing well voltages and simultaneously changing gate voltages and well voltages.

6. A method of erasing a flash memory device, the method comprising:
   (a) initiating an erase procedure of the flash memory device;
   (b) erase verifying a selected number of memory cells;
   (c) applying an erase pulse to the array if undererased bits are determined during step (b);
   (d) determining state of erasure of the selected number of memory cells;
   (e) applying an adjusted vertical electrical filed to the flash memory device, wherein the adjustment to the vertical electrical field is based upon the state of erasure determined in step (d);
   (f) repeating steps (b) through (e) until it is determined in step (b) that there are no undererased bits in the selected number of memory cells;
   (g) erase verifying a next selected number of memory cells;
   (h) repeating steps (c) through (g) until all of the memory cells in the flash memory device have been erased.

7. The method of claim 6 wherein the state of erasure in step (d) is included in step (c).

8. The method of claim 7 wherein the state of erasure is determined by:
   biasing drain voltages above a well voltage; and
   measuring a drain voltage of a selected number of memory cells for a given band-to-band current in the column.

9. The method of claim 6 wherein applying an adjusted vertical electrical field is accomplished by one of the following methods selected from the group including changing gate voltages, changing well voltages and simultaneously changing gate voltages and well voltages.

10. A method of erase verifying and overerase verifying an array of flash memory cells, the method comprising:
    (a) erase verifying a memory cell in a column and a row;
    (b) if the memory cell is undererased determining a state of erasure and applying an adjusting vertical electrical field to the array;
    (c) if the memory cell is properly erased erase verifying a next memory cell;
    (d) repeating steps (a) through (c) until all memory cells in the array of flash memory cells verify as erased;
    (e) overerase verifying a memory cell in a column and a row;
    (f) if the memory cell is overerased applying an overerase correction pulse to the column in which the memory cell is located;
    (g) if the memory cell is properly erased overerase verifying a next memory cell;
    (h) repeating steps (e) through (g) until all memory cells in the array of flash memory cells overerase verify; and
    (i) repeating steps (a) through (c) until all memory cells in the array of flash memory cells verify as erased.

11. The method of claim 10 wherein the state of erasure is determined by:
    biasing gates of the flash memory; and
    measuring a drain voltage of a selected column of memory cells for a given band-to-band current in the column.

12. The method of claim 10 wherein the state of erasure is determined by:

biasing gates of the flash memory; and measuring a drain voltage of all columns of memory cells for a given band-to-band current in the columns.

13. A method of erase verifying and overerase verifying an array of flash memory cells, the method comprising:
   (a) erase verifying a memory cell in a column and a row;
   (b) if the memory cell is undererased applying an erase pulse to the cell and determining a state of erasure;
   (c) adjusting an erase vertical electrical field;
   (d) if the memory cell is properly erased erase verifying a next memory cell;
   (e) repeating steps (a) through (d) until all memory cells in the array of flash memory cells verify as erased;
   (f) overerased verifying a memory cell in a column and a row;
   (g) if the memory cell is overerased applying an overerase correction pulse to the column in which the memory cell is located;
   (h) if the memory cell is properly erased overerase verifying a next memory cell;
   (i) repeating steps (f) through (h) until all memory cells in the array of flash memory cells overerase verify; and
   (j) repeating steps (a) through (d) until all memory cells in the array of flash memory cells verify as erased.

14. The method of claim 13 wherein the state of erasure is determined by:
   biasing drain voltages above a well voltage; and
   measuring a drain voltage of a selected number of memory cells for a given band-to-band current in the column.

15. A method of erase verifying and overerase verifying an array of flash memory cells, the method comprising:
   (a) erase verifying a memory cell in a column and a row;
   (b) if the memory cell is undererased determining a state of erasure and applying an adjusting vertical electrical field to the array;
   (c) if the memory cell is properly erased determining if the memory cell just erase verified is at a last address;
   (d) if the memory cell is not at the last address resetting the address and beginning an overerase verify sequence for the array of flash memory cells;
   (e) applying an overerase correction pulse to a column in which an overerased bit is detected;
   (f) incrementing the column address until the last column of memory cells has been overerase verified;
   (g) erase verifying a next memory cell; and
   (h) repeating steps (a) through (g) until all memory cells have been erase verified.

16. The method of claim 15 wherein the state of erasure is determined by:
   biasing gates of the flash memory; and
   measuring a drain voltage of all columns of memory cells for a given band-to-band current in the columns.

17. A method of erase verifying and overerase verifying an array of flash memory cells, the method comprising:
   (a) erase verifying a memory cell in a column and a row;
   (b) if the memory cell is undererased applying an erase pulse to the array and determining a state of erasure of the memory cell;
   (c) adjusting the erase vertical electric field;
   (d) if the memory cell is properly erased determining if the memory cell just erase verified is at a last address;
   (e) if the memory cell is not at the last address resetting the address and beginning an overerase verify sequence for the array of flash memory cells;
   (f) applying an overerase correction pulse to a column in which an overerased bit is detected;
   (g) incrementing the column address until the last column of memory cells has been overerase verified;
   (h) erase verifying a next memory cell; and
   (i) repeating steps (a) through (h) until all memory cells have been erase verified.

18. The method of claim 17 wherein the state of erasure is determined by:
   biasing gates of the flash memory; and
   measuring a drain voltage of all columns of memory cells for a given band-to-band current in the columns.

* * * * *